US008120103B2

United States Patent
Hong

(10) Patent No.: US 8,120,103 B2
(45) Date of Patent: Feb. 21, 2012

(54) SEMICONDUCTOR DEVICE WITH VERTICAL GATE AND METHOD FOR FABRICATING THE SAME

(75) Inventor: Ki-Ro Hong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 215 days.

(21) Appl. No.: 12/493,775

(22) Filed: Jun. 29, 2009

(65) Prior Publication Data

US 2010/0096693 A1 Apr. 22, 2010

(30) Foreign Application Priority Data

Oct. 17, 2008 (KR) .................... 10-2008-0102113

(51) Int. Cl.
*H01L 29/66* (2006.01)
(52) U.S. Cl. ......... 257/331; 257/E27.091; 257/E27.092; 257/E29.201; 257/E29.346; 257/E21.548
(58) Field of Classification Search .................. 257/296, 257/298, 300–303, 330–332, 397, 374, 500–502, 257/510, 513, 647, E21.548; 438/38, 239, 438/386, 399, 250, 393, 243–244, 259, 270, 438/271, 589, 587, 588, 207, 218, 219, 297, 438/439, 221, 296, 353
See application file for complete search history.

(56) References Cited

U.S. PATENT DOCUMENTS

| | | | | |
|---|---|---|---|---|
| 5,477,071 A * | 12/1995 | Hamamoto et al. | ........... | 257/302 |
| 5,502,320 A * | 3/1996 | Yamada | .......... | 257/302 |
| 5,828,094 A * | 10/1998 | Lee | ................ | 257/296 |
| 5,895,946 A * | 4/1999 | Hamamoto et al. | .......... | 257/302 |
| 6,025,224 A * | 2/2000 | Gall et al. | ................ | 438/243 |
| 6,137,128 A * | 10/2000 | Holmes et al. | .............. | 257/301 |
| 6,355,954 B1 * | 3/2002 | Gall et al. | ................ | 257/297 |
| 6,660,581 B1 * | 12/2003 | Yang et al. | .................. | 438/242 |
| 6,740,919 B2 | 5/2004 | Piazza et al. | ................. | 257/301 |
| 6,946,678 B2 * | 9/2005 | Wu et al. | ........................ | 257/48 |
| 7,321,150 B2 * | 1/2008 | Fishburn et al. | ............. | 257/309 |
| 7,670,909 B2 * | 3/2010 | Cho | ................ | 438/268 |
| 7,713,823 B2 * | 5/2010 | Sung et al. | .................... | 438/272 |
| 7,741,178 B2 * | 6/2010 | Yi | ................................. | 438/259 |

(Continued)

FOREIGN PATENT DOCUMENTS

KR 19950011637 10/1995

(Continued)

OTHER PUBLICATIONS

Notice of Preliminary Rejection issued from Korean Intellectual Property Office on Sep. 29, 2010.

*Primary Examiner* — Eugene Lee
*Assistant Examiner* — Mohammed Shamsuzzaman
(74) *Attorney, Agent, or Firm* — IP & T Group LLP

(57) ABSTRACT

A semiconductor device includes a substrate; a plurality of active pillars formed over the substrate; bulb-type trenches, each of the bulb-type trenches formed inside the substrate between the active pillars; buried bit lines, each of the buried bit lines being formed on a sidewall of a respective one of the bulb-type trenches; and vertical gates, each of the vertical gates being formed to surround a sidewall of a respective one of the active pillars.

12 Claims, 8 Drawing Sheets

U.S. PATENT DOCUMENTS

| | | | |
|---|---|---|---|
| 7,781,285 B2 * | 8/2010 | Kim et al. | 438/242 |
| 7,829,415 B2 * | 11/2010 | Cho et al. | 438/268 |
| 7,858,477 B2 * | 12/2010 | Kim | 438/270 |
| 7,871,887 B2 * | 1/2011 | Kim et al. | 438/270 |
| 7,902,026 B2 * | 3/2011 | Chung et al. | 438/270 |
| 7,939,411 B2 * | 5/2011 | Jung | 438/270 |
| 2001/0055846 A1 | 12/2001 | Beckmann et al. | 438/243 |
| 2002/0121657 A1 * | 9/2002 | Chen | 257/296 |
| 2003/0169629 A1 * | 9/2003 | Goebel et al. | 365/200 |
| 2004/0197989 A1 * | 10/2004 | Sommer et al. | 438/243 |
| 2005/0085096 A1 * | 4/2005 | Low et al. | 438/778 |
| 2005/0250290 A1 * | 11/2005 | Temmler | 438/387 |
| 2006/0043450 A1 * | 3/2006 | Tang et al. | 257/302 |
| 2006/0258084 A1 * | 11/2006 | Tang et al. | 438/239 |
| 2007/0080385 A1 * | 4/2007 | Kim et al. | 257/296 |
| 2007/0173007 A1 * | 7/2007 | Lee et al. | 438/209 |
| 2007/0224763 A1 * | 9/2007 | Fujimoto et al. | 438/259 |
| 2008/0283910 A1 * | 11/2008 | Dreeskornfeld et al. | 257/332 |
| 2008/0305592 A1 * | 12/2008 | Chien | 438/243 |
| 2009/0004797 A1 * | 1/2009 | Lee | 438/270 |
| 2009/0026541 A1 * | 1/2009 | Chung | 257/347 |
| 2009/0108340 A1 * | 4/2009 | Seo | 257/329 |
| 2009/0127609 A1 * | 5/2009 | Han et al. | 257/311 |
| 2009/0163027 A1 * | 6/2009 | Yi | 438/700 |
| 2009/0166723 A1 * | 7/2009 | Sung et al. | 257/328 |
| 2009/0170275 A1 * | 7/2009 | Ban | 438/421 |
| 2009/0218616 A1 * | 9/2009 | Jang et al. | 257/330 |
| 2009/0230466 A1 * | 9/2009 | Kim | 257/331 |
| 2009/0242971 A1 * | 10/2009 | Cho et al. | 257/328 |
| 2009/0253236 A1 * | 10/2009 | Cho et al. | 438/268 |
| 2009/0256194 A1 * | 10/2009 | Kim et al. | 257/330 |
| 2010/0301410 A1 * | 12/2010 | Hirler | 257/334 |
| 2011/0008941 A1 * | 1/2011 | Lee et al. | 438/270 |

FOREIGN PATENT DOCUMENTS

| | | |
|---|---|---|
| KR | 100961194 | 6/2010 |

* cited by examiner

SEMICONDUCTOR DEVICE WITH VERTICAL GATE AND METHOD FOR FABRICATING THE SAME

CROSS-REFERENCE TO RELATED APPLICATIONS

The present application claims priority of Korean Patent Application No. 10-2008-0102113, filed on Oct. 17, 2008, the disclosure of which is incorporated herein by reference in its entirety.

BACKGROUND OF THE INVENTION

The present invention relates to a method for fabricating a semiconductor device, and more particularly, to a semiconductor device with vertical gates and a method for fabricating the semiconductor device.

Decreasing design rules of Dynamic Random Access Memory (DRAM) has brought about much difficulty in the fabrication of DRAM of under 40 nm-class. To overcome the difficulty, researchers have sought to form vertical gates instead of planar gates.

In a semiconductor device with vertical gates, a vertical gate is fabricated by processing a substrate to have an active pillar including a neck pillar and a top pillar and by growing a gate insulation layer. As the vertical gate has a structure of surrounding the external walls of the neck pillar of the active pillar, a channel stretched in a vertical direction is formed between the upper part and the lower part of the active pillar.

Dividing an active pillar into a neck pillar and a top pillar works as an obstacle to high integration because it makes a space between top pillars. Specifically, the active pillar may collapse due to weak supporting force of the neck pillar, which is problematic.

To solve this problem, a neck-free vertical gate capable of securing space between active pillars and preventing pattern collapse was suggested. The neck-free vertical gate refers to a vertical gate structure surrounding a straight line-type active pillar without a neck pillar.

FIG. 1A is a plan view illustrating a conventional semiconductor device having a neck-free vertical gate, and FIG. 1B is a cross-sectional view showing the conventional semiconductor device of FIG. 1A taken along a line A-A'.

Referring to FIGS. 1A and 1B, active pillars 12 are formed over a substrate 11, and a hard mask layer 13 is formed over the active pillars 12. The external walls of each active pillar 12 are surrounded by the gate insulation layer 14 and a vertical gate 15. Inside the substrate 11, buried bit lines 16 are formed through impurity ion implantation. Adjacent buried bit lines 16 are separated from each other by trenches 17.

The above-described prior art describes a structure to be applied to a DRAM having a design rule of $4F^2$, where F denotes minimum feature. Since the structure does not have a neck pillar, it can stably form the active pillar.

However, the above method can hardly secure dimensions for a process of forming buried bit lines through impurity ion implantation if the DRAM has a high integration design rule of under $3F^2$, whose integration degree is higher than that of the $4F^2$.

SUMMARY OF THE INVENTION

An embodiment of the present invention is directed to provide a semiconductor device with vertical gates that can easily secure dimensions for a process of forming buried bit lines even in a design rule of under $3F^2$, and a method for fabricating the semiconductor device.

In accordance with an aspect of the present invention, there is provided a semiconductor device, which includes: a substrate; a plurality of active pillars, each of the bulb-type trenches formed over the substrate; bulb-type trenches formed inside the substrate between the active pillars; buried bit lines, each of the buried bit lines being formed on each sidewall of a respective one of the bulb-type trenches; and vertical gates, each of the vertical gates being formed to surround a sidewall of a respective one of the active pillars.

The plurality of active pillars may include a number of active pillar array pairs, wherein the active pillar array pairs are arranged with the second space therebetween and active pillar arrays in each active pillar array pairs are arranged with the first space therebetween, the second space being narrower than the first space. The bulb-type trenches may be formed inside the substrate beneath the first space.

In accordance with another aspect of the present invention, there is provided a method for fabricating a semiconductor device, which includes: forming a plurality of preliminary active pillars arrayed with a first space and a second space by etching a substrate, the second space being narrower than the first space; forming bulb-type trenches by etching the substrate beneath the first space; forming buried bit lines, each of the buried bit lines being formed on each sidewall of the respective one of the bulb-type trenches; forming a plurality of active pillars by etching the preliminary active pillars; and forming vertical gates, each of the vertical gates surrounding a sidewall of a respective one of the active pillars.

The forming of the bulb-type trenches may include: forming a spacer layer to gap-fill the second space between the preliminary active pillars; performing an etch-back on the spacer layer; and forming the bulb-type trenches by etching the substrate with the spacer layer used as an etch barrier. The spacer layer may gap-fill the second space and cover sidewalls and an upper portion of the preliminary active pillars neighboring with the first space therebetween.

The preliminary active pillars may be formed in a line shape, and the active pillars may be formed through an etch process performed by using a line-shaped photoresist pattern perpendicularly crossing the preliminary active pillars. Each of the active pillars may be formed in a straight line shape without a neck.

DESCRIPTION OF SPECIFIC EMBODIMENTS

Figure 1A:
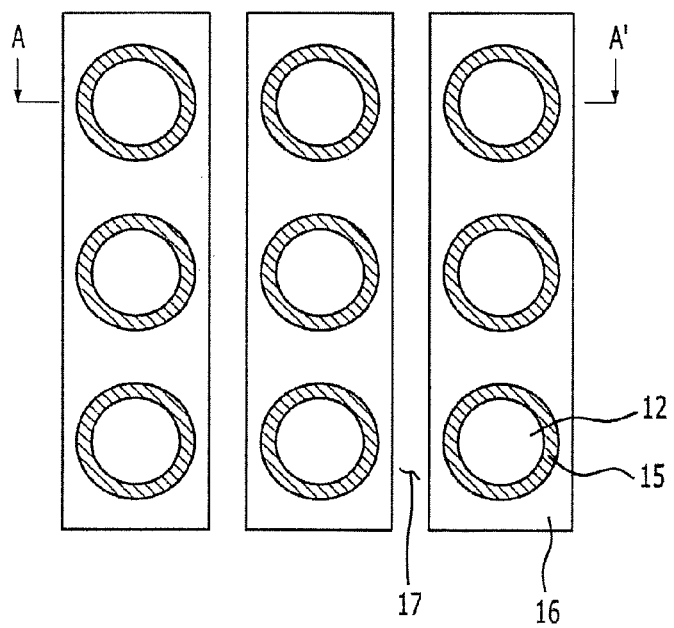
FIG. 1A is a plan view illustrating a conventional semiconductor device with neck-free vertical gates.
Figure 1B:
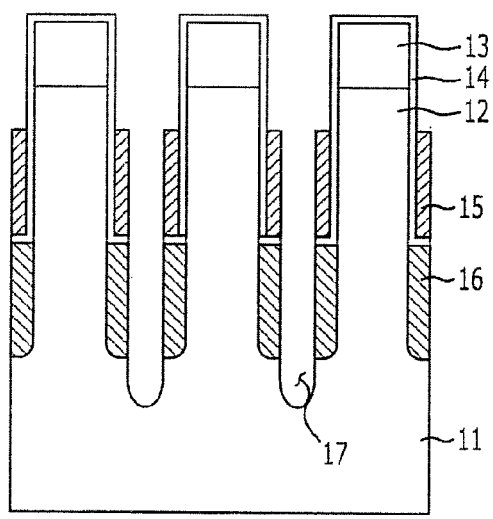
FIG. 1B is a cross-sectional view showing the conventional semiconductor device of FIG. 1A taken along a line A-A'.

Other objects and advantages of the present invention can be understood by the following description, and become apparent with reference to the embodiments of the present invention.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

The present invention provides a method of forming buried bit lines on the sidewalls of bulb-type trenches to secure dimensions for the buried bit lines in a semiconductor device with straight line-type neck-free vertical gates.

Figure 2A:
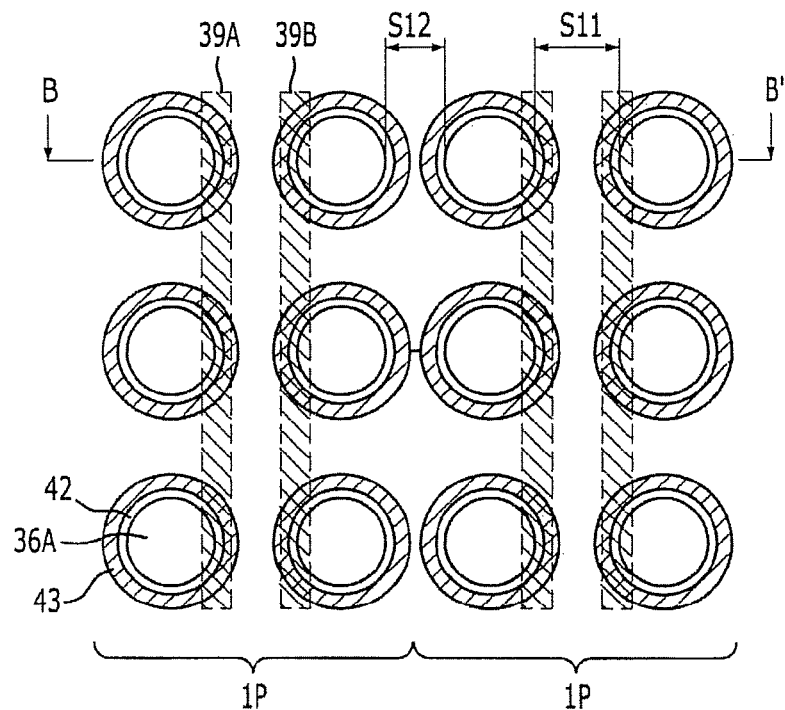
FIG. 2A is a plan view describing a semiconductor device with neck-free vertical gates in accordance with an embodiment of the present invention.
Figure 2B:
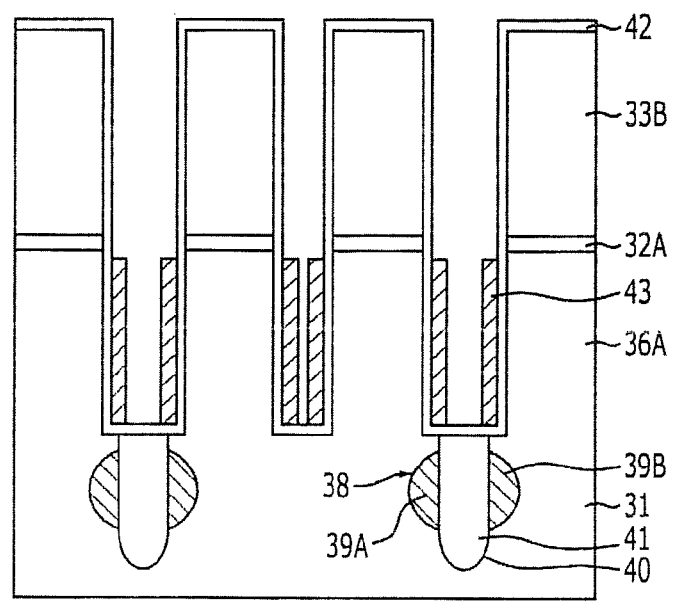
FIG. 2B is a cross-sectional view showing the semiconductor device of FIG. 2A taken along a line B-B'.

FIG. 2A is a plan view describing a semiconductor device with neck-free vertical gates in accordance with an embodiment of the present invention. FIG. 2B is a cross-sectional view showing the semiconductor device of FIG. 2A taken along a line B-B'.

Referring to FIGS. 2A and 2B, a plurality of active pillars 36A are formed over a silicon substrate 31. A plurality of the active pillars 36A are not arrayed with a uniform space between them but they are arrayed with a first space and a second space, where the first space and the second space are not the same. For example, two active pillar arrays, each including a plurality of active pillars, constitute an active pillar array pair 1P. The two active pillar arrays included in each active pillar array pair are arranged with the first space S11 between the active pillar arrays, and the active pillar array pairs 1P are arranged with second space S12 between them. The second space S12 between active pillar array pairs 1P is narrower than the first space S11. In other words, the active pillars 36A are arrayed with two space units, and the space S11 between the active pillars within an active pillar array pair 1P is made wide, while the space S12 between active pillar array pairs is made narrow.

Bulb-type trenches 38 are formed in the silicon substrate 31 beneath the first space S11, which is wide space between the active pillars 36A. The bulb-type trenches 38 are not formed in the silicon substrate 31 beneath the second space S12, which is narrow space between the active pillar array pairs.

Buried bit lines 39A and 39B are buried on the sidewalls of the bulb-type trenches 38. The buried bit lines 39A and 39B include a metal layer or a metal nitride layer. Specifically, the buried bit lines 39A and 39B may include a tungsten (W) layer or a titanium nitride (TiN) layer.

Trenches 40 may be further formed at the bottom of the bulb-type trenches 38 to separate adjacent buried bit lines 39A and 39B from each other. The inside of the trenches 40 and the bulb-type trenches 38 is gap-filled with an interlayer dielectric layer 41.

Each of vertical gates 43 is formed to surround the sidewall of a respective active pillar 36A, and a gate insulation layer 42 is interposed between the active pillar 36A and the vertical gate 43. The active pillar 36A has a shape of straight line without a neck.

Referring to FIG. 2A, which is a plan view of this embodiment, the buried bit lines 39A and 39B are not formed on both sides of the active pillars 36A, but they are formed on any one side of them. Forming the buried bit lines 39A and 39B on one side of the active pillars 36A facilitates the formation of $3F^2$, which is advantageous to improving the integration degree.

FIGS. 3A to 3I are cross-sectional views describing a method for fabricating a semiconductor device with neck-free vertical gates in accordance with an embodiment of the present invention.

Figure 3A:
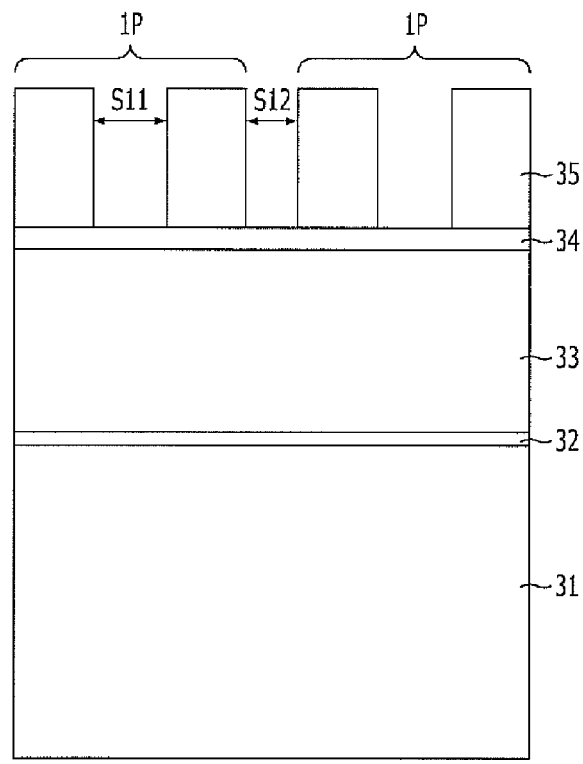
FIGS. 3A to 3I are cross-sectional views describing a method for fabricating a semiconductor device with neck-free vertical gates in accordance with an embodiment of the present invention.

Referring to FIG. 3A, a pad oxide layer 32 is formed over the silicon substrate 31 and a hard mask layer 33 is formed over the pad oxide layer 32. The hard mask layer 33 may include at least any one selected from the group consisting of a nitride layer, an oxide layer, and an amorphous carbon layer. The hard mask layer 33 may have a multi-layer structure. For instance, the hard mask layer 33 may be formed by stacking a nitride layer, an oxide layer, and an amorphous carbon layer. The hard mask layer 33 is used as an etch barrier.

An anti-reflection film 34 is formed over the hard mask layer 33 and then a first photoresist pattern 35 is formed. The first photoresist pattern 35 is patterned in a line-space type. Two lines of the first photoresist pattern 35 having the first space S1 become a line pair 1P, and the second space S2 between line pairs is narrower than the first space S1.

Figure 3B:
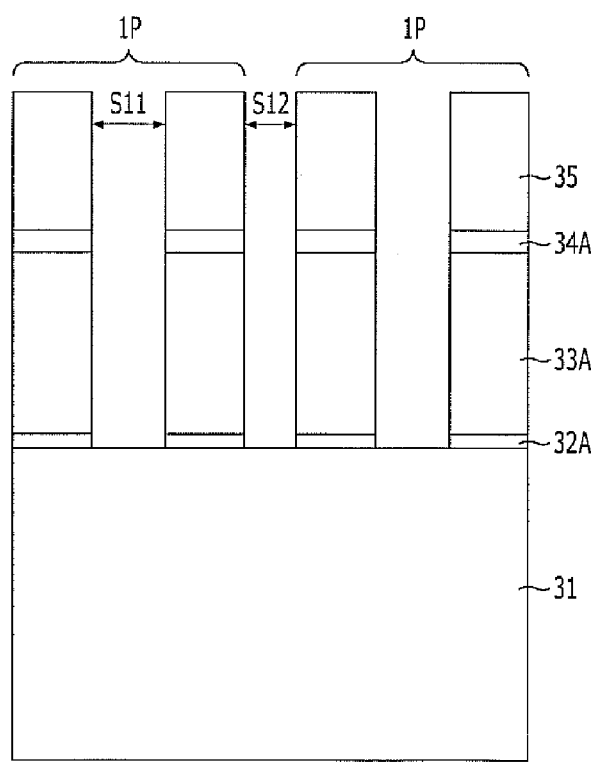

Referring to FIG. 3B, the anti-reflection film 34 is etched using the first photoresist pattern 35 as an etch barrier to thereby form an anti-reflection pattern 34A. Subsequently, the hard mask layer 33 and the pad oxide layer 32 are etched to thereby form a hard mask pattern 33A and a pad oxide pattern 32A. Herein, since the shape of the first photoresist pattern 35 is transferred to the hard mask pattern 33A and the pad oxide pattern 32A, the hard mask pattern 33A and the pad oxide pattern 32A is patterned in the line-space type as well.

Figure 3C:
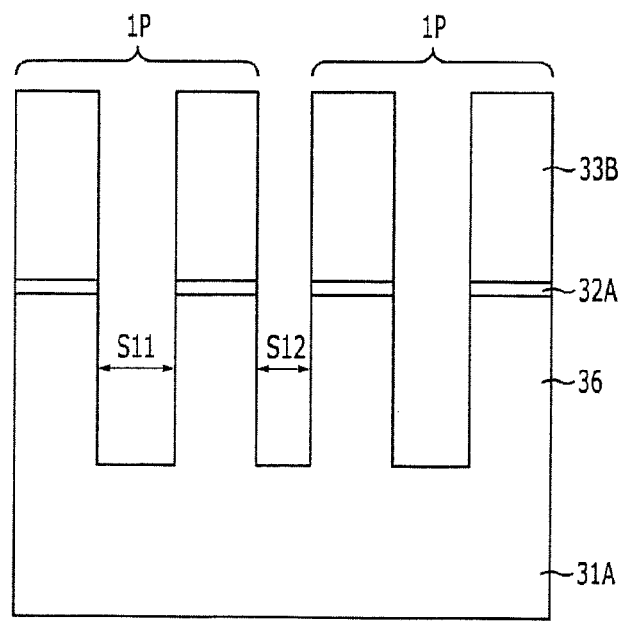

Referring to FIG. 3C, the first photoresist pattern 35 and the anti-reflection pattern 34A are removed through a photoresist layer stripping process.

The silicon substrate 31 is etched to a predetermined depth by using the hard mask pattern 33A as an etch barrier. This is referred to as 'primary pillar etch.' The primary pillar etch produces a plurality of preliminary active pillars 36 that will function as an active region. Herein, the silicon substrate obtained after the primary pillar etching is marked as '31A.' Some of the hard mask pattern 33A is lost during the primary pillar etch and the hard mask pattern remaining after the primary pillar etching has a reduced thickness. The thin hard mask pattern is marked as '33B.'

Since the preliminary active pillars 36 are formed by the hard mask pattern 33A whose shape is copied from the shape of the first photoresist pattern 35, the preliminary active pillars 36 are also patterned in the line-space type. In other words, when looked from the top, the preliminary active pillars 36 include a plurality of lines, and two lines having the first space S11 between them form a line pair 1P and the second space S12 between line pairs is narrower than the first space S11.

The primary pillar etch is an anisotropic etch. Since the silicon substrate 31 is etched, the anisotropic etch may be a plasma dry etch performed using $Cl_2$ or HBr gas alone, or a gas mixture thereof.

The primary pillar etch forms the plurality of preliminary active pillars 36 over the primarily etched substrate 31A, and the pad oxide pattern 32A and the remaining hard mask pattern 33B remains over the plurality of preliminary active pillars 36.

Figure 3D:
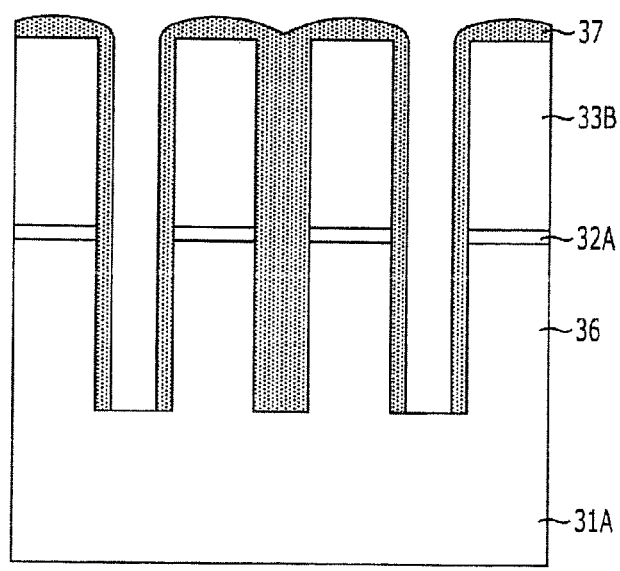

Referring to FIG. 3D, a spacer layer is deposited over the resultant substrate. Although not all the first space S11 may be gap-filled between the preliminary active pillars 36 during the deposition of the spacer layer, the second space S12, which is narrower than the first space S11, are all gap-filled.

Subsequently, the spacer layer is etched back to thereby form spacers 37 exposing the surface of the primarily etched substrate 31A between the preliminary active pillars 36. Herein, the spacers 37 gap-filling the second space S12 are not etched but remain. Thus, the surface of the primarily etched substrate 31A beneath the second space S12 is not exposed.

Figure 3E:
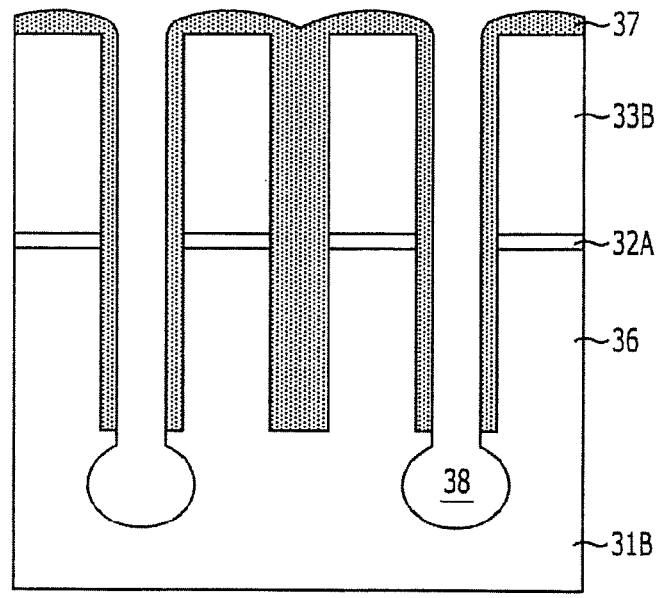

Referring to FIG. 3E, the primarily etched substrate 31A exposed through the etch-back of the spacer layer is etched again to thereby form bulb-type trenches 38. The bulb-type trenches 38 are formed by performing anisotropic etch and isotropic etch sequentially. Herein, the resultant substrate obtained after the sequential process of anisotropic etch and isotropic etch is marked as '31B.'

During the etch process, the preliminary active pillars 36 are protected by the spacers 37.

Figure 3F:
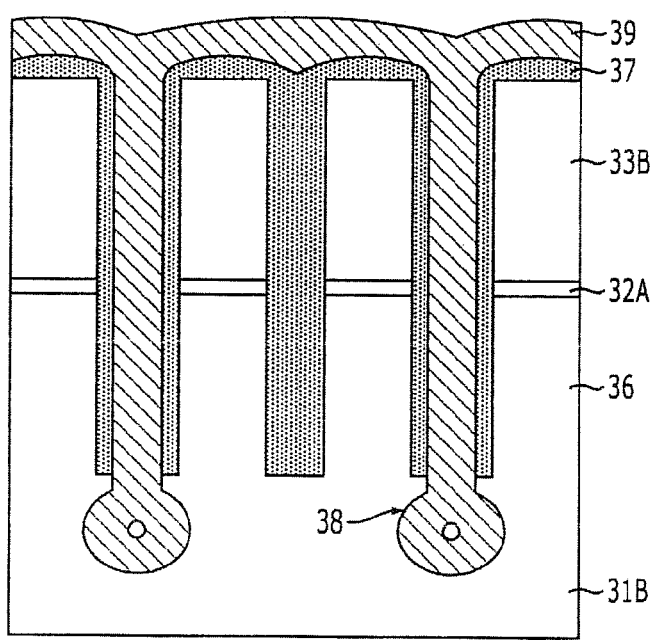

Referring to FIG. 3F, a conductive layer 39 is deposited over the resultant substrate including the bulb-type trenches 38. The conductive layer 39 may be deposited to a thickness so thick as to gap-fill the bulb-type trenches 38. Herein, the conductive layer 39 includes a metal layer or a metal nitride layer, specifically, a tungsten (W) layer or a titanium nitride (TiN) layer.

Figure 3G:
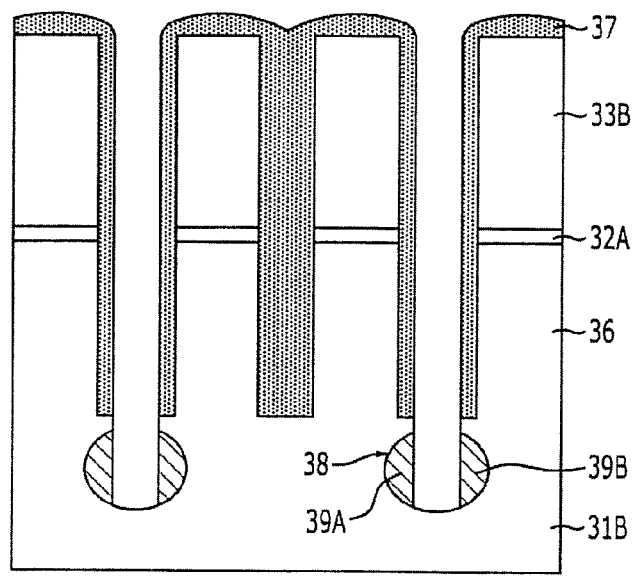

Referring to FIG. 3G, the conductive layer 39 is etched back to thereby form buried bit lines 39A and 39B which are buried in the side walls of the bulb-type trenches 38 to be separated. Forming the buried bit lines 39A and 39B of a metal layer or a metal nitride layer is more advantageous in the aspect of resistance than forming them through ion implantation and thus it becomes easy to realize high-speed operation.

Figure 3H:
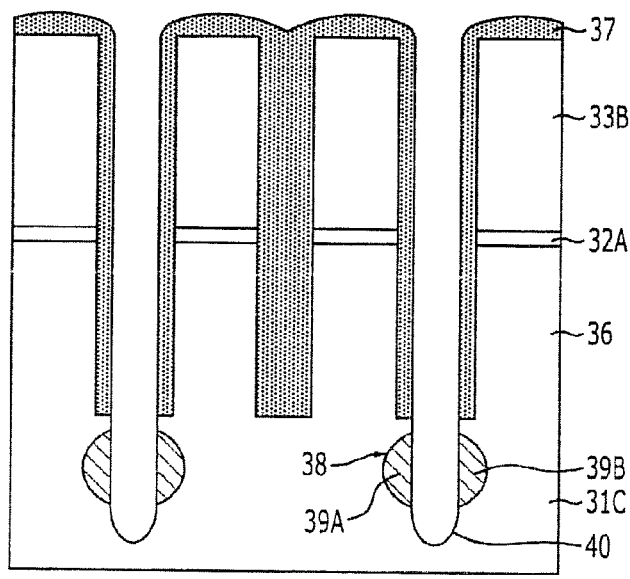

Referring to FIG. 3H, trench etch is performed to further separate the buried bit lines 39A and 39B. Trenches 40 formed from the trench etch enhance the electrical separation between adjacent buried bit lines. Herein, the trench-etched substrate is marked as '31C.'

Figure 3I:
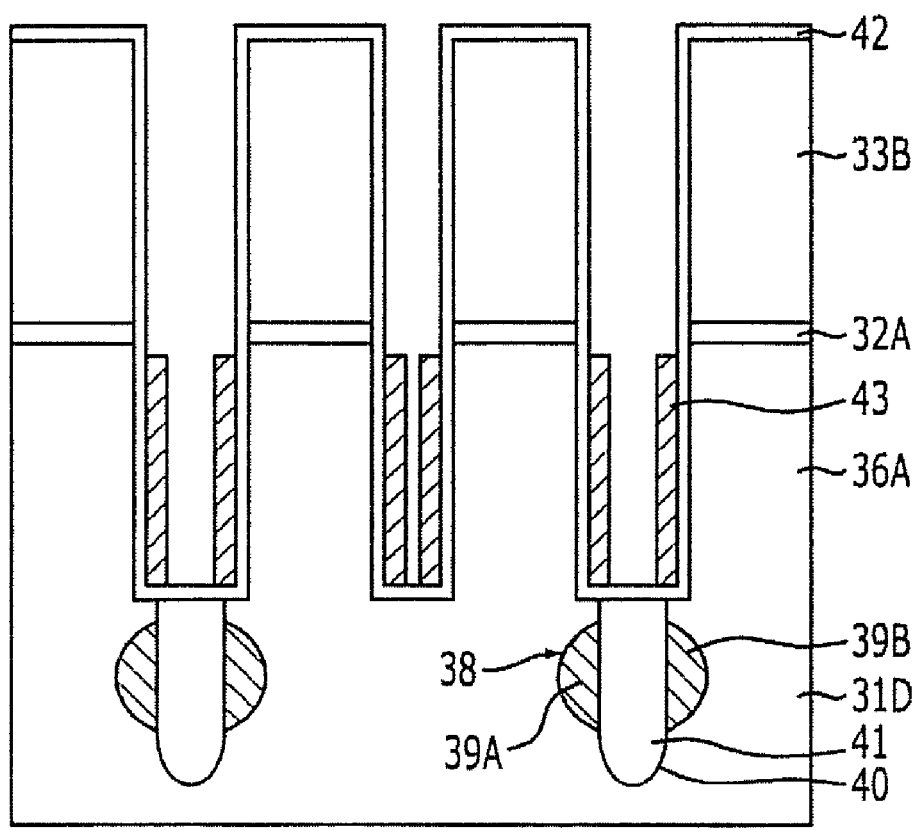

Referring to FIG. 3I, the spacers 37 are removed and an interlayer dielectric layer 41 fills the bulb-type trenches 38. Subsequently, secondary pillar etch is performed onto the interlayer dielectric layer 41 and the preliminary active pillars 36 by using a second photoresist pattern (see FIG. 4A) patterned in a direction perpendicularly crossing the preliminary active pillars 36 as an etch barrier to thereby form active pillars 36A. Herein, the secondarily etched substrate is marked as '31D.'

Figure 4A:
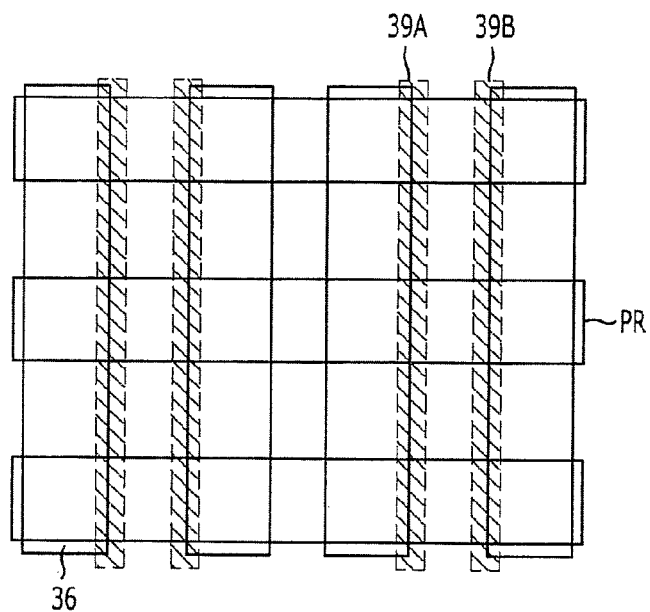
FIG. 4A is a plan view showing a substrate structure with a second photosensitive pattern formed therein.

FIG. 4A is a plan view showing a substrate structure with a second photosensitive (PR) pattern formed therein. The second photoresist pattern has a shape of line-space patterned in a direction perpendicularly crossing the buried bit lines 39A and 39B and the preliminary active pillars 36. When the preliminary active pillars 36 are etched using the second photoresist pattern as an etch barrier, a plurality of active pillars 36A are formed arrayed in the form of matrix. The active pillars 36A have a stable straight line structure without a neck. The plan shape of the active pillars 36A may be circular as the etch proceeds.

Subsequently, a gate insulation layer 42 may be formed over the entire substrate structure, and vertical gates 43 may be formed to surround the sidewalls of the active pillars 36A. The vertical gates 43 are formed by depositing a gate conductive layer over the substrate structure with the gate insulation layer 42 and performing an etch-back thereon. Herein, the gate conductive layer may be a polysilicon layer doped with N-type impurity or a polysilicon layer doped with P-type impurity. Also, a polysilicon layer doped with impurity and a metal layer may be stacked one another to be used as the gate conductive layer, or a metal layer may be used alone.

Figure 4B:
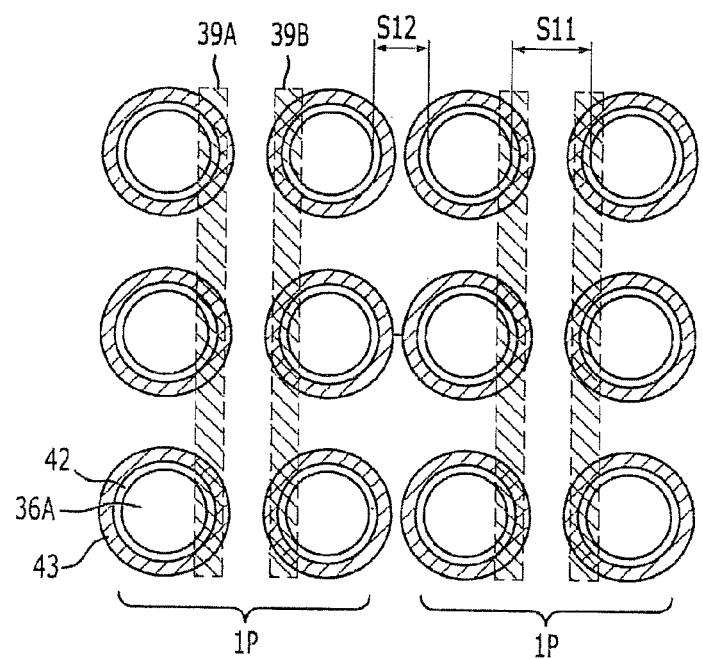
FIG. 4B is a plan view showing a substrate structure with a vertical gate formed therein.

FIG. 4B is a plan view showing a substrate structure with vertical gates formed therein. It can be seen from the drawing that the gate insulation layer 42 and the vertical gates 43 surround the sidewalls of the active pillars 36A. In the active pillars 36A, an active pillar array pair 1P of active pillar arrays each including a plurality of active pillars has the first space S11 between the active pillar arrays, and the second space S12 between active pillar array pairs is narrower than the first space S11.

The method of the present invention can easily form buried bit lines in a highly integrated semiconductor device of under $3F^2$ whose integration degree is higher than that of $4F^2$ by forming active pillars with wide and narrow spaces between them on the basis of two active pillar arrays and then forming the buried bit lines on the sidewalls of bulb-type trenches.

Also, the method of the present invention can easily secure dimensions for a process of forming buried bit lines in a high integration design rule of under $3F^2$ by forming the buried bit lines on the sidewalls of the bulb-type trenches.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plurality of preliminary active pillars arrayed with a first space and a second space by etching a substrate, the second space being narrower than the first space;
    forming bulb-type trenches by etching the substrate beneath the first space;
    forming buried bit lines, each of the buried bit lines being formed on each sidewall of a respective one of the bulb-type trenches;
    forming a plurality of active pillars by etching the preliminary active pillars; and
    forming vertical gates, each of the vertical gate surrounding a sidewall of a respective one of the active pillars.

2. The method of claim 1, wherein the forming of the bulb-type trenches includes:
    forming a spacer layer to gap-fill the second space between the preliminary active pillars;
    performing an etch-back on the spacer layer; and
    forming the bulb-type trenches by etching the substrate with the spacer layer used as an etch barrier.

3. The method of claim 2, wherein the spacer layer gap-fills the second space and covers sidewalls and an upper portion of the preliminary active pillars neighboring with the first space therebetween.

4. The method of claim 2, wherein the spacer layer includes an oxide layer.

5. The method of claim 1, wherein the forming of the buried bit lines includes:
    depositing a conductive layer which gap-fills the bulb-type trenches over a substrate structure; and
    performing an etch-back onto the conductive layer.

6. The method of claim 5, wherein the conductive layer includes a metal layer or a metal nitride layer.

7. The method of claim 6, wherein the conductive layer includes a tungsten (W) layer or a titanium nitride (TiN) layer.

8. The method of claim 1, wherein the plurality of preliminary active pillars are formed in a line-space type by using a hard mask layer as an etch barrier.

9. The method of claim 8, wherein the hard mask layer includes a nitride layer, an oxide layer, and an amorphous carbon layer stacked sequentially.

10. The method of claim 1, further comprising, after the forming of the buried bit lines, forming trenches by further etching a bottom portion of each of the bulb-type trenches.

11. The method of claim 1, wherein the preliminary active pillars are formed in a line shape, and the active pillars are formed through an etch process performed by using a line-shaped photoresist pattern perpendicularly crossing the preliminary active pillars.

12. The method of claim 11, wherein each of the active pillars is formed in a straight line shape without a neck.

* * * * *